United States Patent [19]

Schaeffer et al.

[11] Patent Number: 5,060,846

[45] Date of Patent: Oct. 29, 1991

[54] INTEGRATED LOAD COMPENSATION DEVICE

[75] Inventors: Daniel J. Schaeffer, Arlington Heights; Raymond M. Fardoux, Wilmette; Robert P. Dein, Elmhurst; Linda D. Limper, Glenview, all of Ill.

[73] Assignee: Motorola, Inc., Schaumburg, Ill.

[21] Appl. No.: 512,722

[22] Filed: Apr. 23, 1990

[51] Int. Cl.$^5$ .............................................. B23K 3/08
[52] U.S. Cl. .................................. 228/447; 228/49.1
[58] Field of Search ................ 228/6.2, 44.7, 47, 49.1, 228/180.2, 212; 269/900, 903, 254 R; 29/741, 760

[56] References Cited

U.S. PATENT DOCUMENTS

| | | | |
|---|---|---|---|
| 3,516,155 | 6/1970 | Smith | 228/44.7 |
| 3,568,263 | 3/1971 | Meehan | 269/903 |
| 3,765,590 | 10/1973 | Duffek et al. | 228/44.7 |
| 3,995,845 | 12/1976 | Sheffer | 228/44.7 |
| 4,175,728 | 11/1979 | Ferguson | 269/254 R |
| 4,533,129 | 8/1985 | Malmquist et al. | 29/760 |
| 4,575,060 | 3/1986 | Kitagawa | 269/903 |
| 4,595,185 | 6/1986 | Kitagawa | 269/903 |
| 4,615,927 | 10/1986 | Holtzmann | 269/903 |
| 4,638,938 | 1/1987 | Yarne et al. | 228/44.7 |

FOREIGN PATENT DOCUMENTS 2143338 3/1972 Fed. Rep. of Germany ........ 29/760

OTHER PUBLICATIONS

"Fine Pitch Case History: Mass Reflow Soldered, SMT Compatible TAB", by John Altendorf, and Rob Nicol, Surface Mount Technology, Jun. 1989, pp. 9-12.

Primary Examiner—Samuel M. Heinrich
Attorney, Agent, or Firm—Val Jean F. Hillman

[57] ABSTRACT

The present invention discloses a device for positioning a multi-planar or multi-leaded surface mount electronic component on a printed circuit board (PCB) during reflow soldering. By design this non-conductive device made of thermoplastic resins comprises a fence, having a cavity, wherein the electronic component is positioned relative to printed circuit board foot print contacts. Attached to the bottom surface of the fence is a pair of collapsible slotted pegs. These pegs extend vertically downward from the fence and are adapted to provide a snap-fit insertion and retention mechanism whereby the fence is held in place by inserting the collapsible pegs into holes in a printed circuit board. Thereafter, a pair of cantilever beams which are attached to the fence sidewalls and extend into the fence cavity, make contact with the electronic component. As the fence is inserted into the printed circuit board, the cantilever beams press and hold the electronic component in place during reflow soldering. Thereafter, the fence may remain or be removed from the PCB with no impact upon circuit performance.

20 Claims, 2 Drawing Sheets

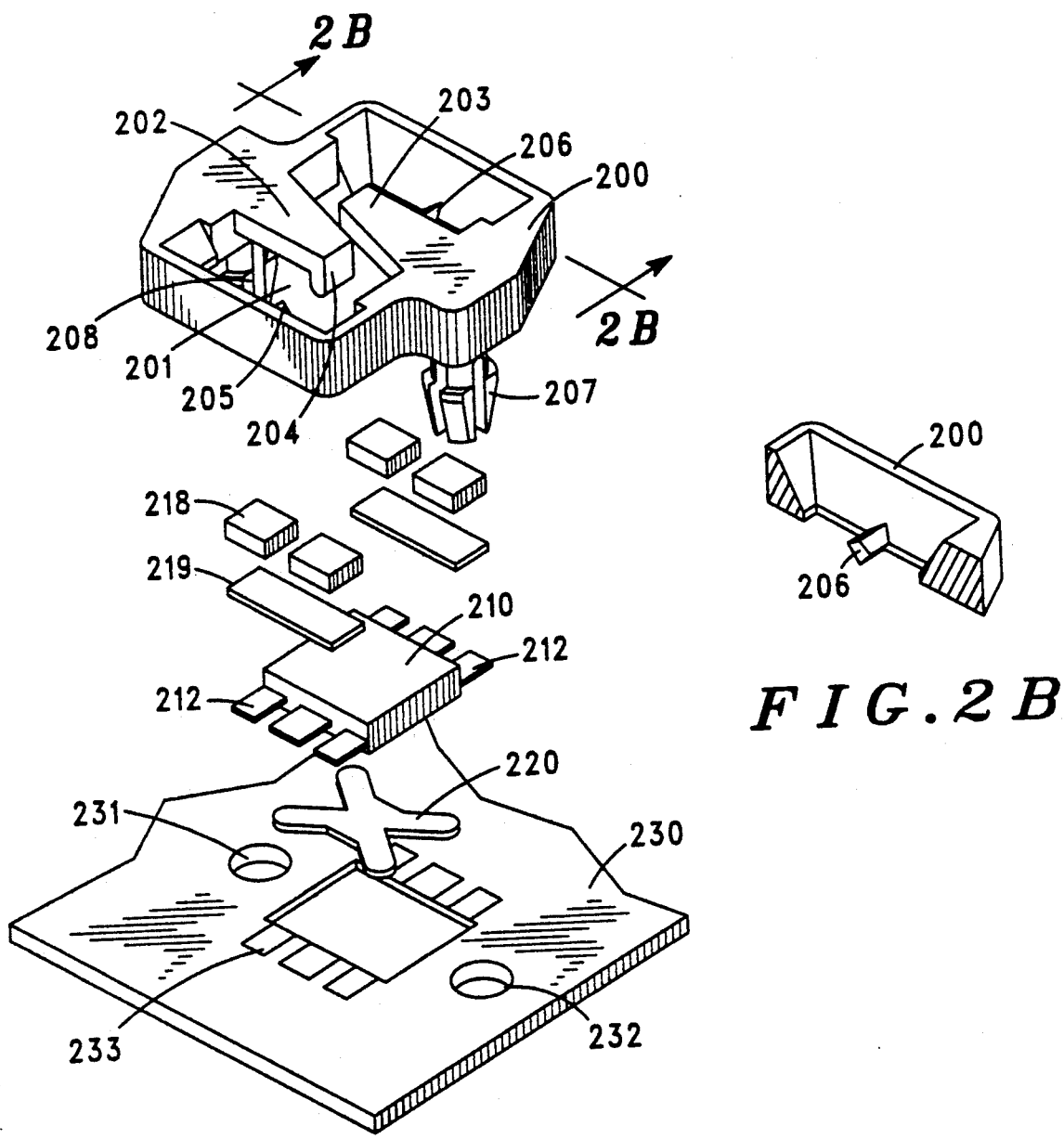
FIG. 2A
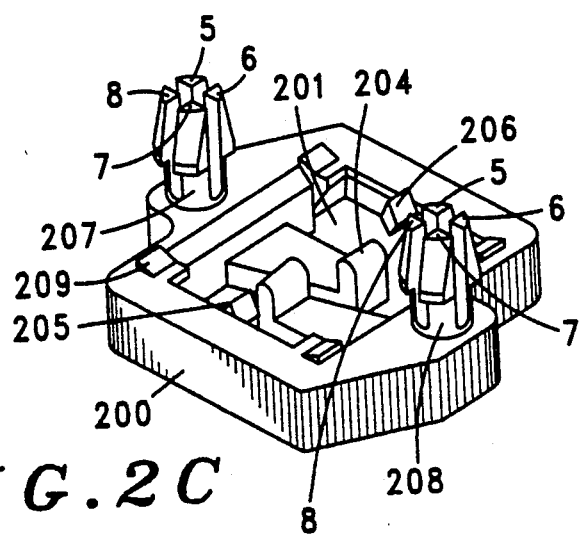
FIG. 2B
FIG. 2C

INTEGRATED LOAD COMPENSATION DEVICE

TECHNICAL FIELD

This invention relates generally to workpieces used during soldering procedures. In particular, it addresses the need for devices that position surface mount electronic components and ancillary devices on printed circuit boards (PCB) during soldering.

BACKGROUND OF THE INVENTION

Unrestrained multi-planar or multi-leaded surface mount electronic components (e.g. power transistor) and ancillary devices (e.g. matching capacitors) tend to float in the emulsified solder during reflow soldering. As a results, the final position of these unrestrained devices is quite unpredictable. It is typical, therefore, that one or more of the component leads will fail to make proper contact with the circuit board, thereby rendering the circuit inoperative. In a similar fashion, imprecise ancillary device location adversely impacts upon circuit operation as well.

In response, the industry enlists the aid of complex spring loaded carriages or fixtures, designed to provide a clamping force upon the individual components throughout the reflow solder process. While this approach tends to resolve the problem of electronic component positioning, it nevertheless suffers from additional shortcomings.

The spring loaded carriages/fixtures are metal devices, considerably larger than the circuit boards that they house. Because of their metallic structure, the carriages/fixtures act like large heat sinks, thereby necessitating longer bake cycle times at higher temperatures in order to assure proper soldering. Unfortunately, the extended exposure represents a substantial threat to both temperature sensitive components and to solder joint integrity.

The spring loaded carriages are costly to manufacture and maintain. The primary manufacturing expense is tooling. Currently, each circuit board type requires one, some times two carriages to complete a reflow process. Each time a circuit board is redesigned, however, new carriages must be designed and manufactured in order to accommodate component repositioning. The added expense, however, often outweighs the original benefit anticipated by the circuit board redesign, thereby rendering such progresses impracticable. Additionally, severe maintenance costs arise from the rapid deterioration of these metal fixtures due to repeated use, temperature cycling, and the inevitable contamination and corrosion from oxidation, charring, and solder residue accumulations.

When ancillary devices are utilized, a stamped metal frame surrounding the electronic component is employed as a positioning guide. Its purpose is to maintain the relative position of the ancillary device to an electronic component lead, throughout the reflow solder process. Because these frames are metallic, however, they tend to draw solder away from the leads, thereby potentially compromising each lead connection. Additionally, these metal guides add sufficient thermal mass to compound the problem of longer bake cycle times at higher temperatures.

These and other shortcomings are endemic to metallic workpieces. While they tend to combat some of the problems associated with unrestrained reflow soldering, they are nevertheless plagued by troubles of a different nature. As previously discussed metallic workpieces represent a major expenditure in tooling and maintenance costs which severely burden PCB redesign efforts. In addition, the use of metallic workpieces during reflow soldering greatly increases oven cycle times. Moreover, the large spring loaded carriages/fixtures are not integratable into the ultimate PCB design, thus they must be removed prior to testing and operation.

It would therefore be extremely advantageous to provide a non-metallic device capable of providing the clamping function of a spring loaded carriage, the positioning function of the metallic frame guide, and yet adaptable for use with individual electronic components, thereby eliminating the need to redesign and manufacture new tooling after every new PCB layout.

SUMMARY OF THE INVENTION

Accordingly, a general object of the present invention is to provide a device capable of maintaining the relative position of surface mount electronic components during reflow soldering.

Another object of the present invention is to provide a device capable of maintaining the relative position of ancillary devices during soldering.

Another object of the present invention is to provide a device that is adapted for use with individual electronic components.

Yet another object of the present invention is to provide a device capable of assuring void-free reflow soldering.

A further object of the present invention is to provide a device that may be integrated into the overall PCB design.

These and other objects are achieved by the present invention which, briefly described, is a load compensation device for fastening and positioning electronic components on a substrate. By design this device comprises a fence, having a cavity, wherein the electronic component is positioned relative to printed circuit board footprint contacts. Thereafter, a pair of cantilever beams which are attached to the fence sidewalls and extend into the fence cavity, make contact with the electronic component. Attached to the bottom of the fence are a pair of slotted pegs. These pegs extend vertically downward from the fence and provide a snap-fit insertion and retention mechanism whereby the cantilever beams will press and hold the electronic component in place after the fence is snapped into place by inserting the pegs into holes in the substrate (e.g. PCB). In this way, electronic component placement, lead surface area contact, and void-free reflow soldering are optimized by the resultant cantilever beam force, which urges the electronic components toward the substrate.

In another embodiment the fence has a plurality of side tabs which extend from the fence sidewalls into the fence cavity. These side tabs provide a dual function. First, they create a solder shut-off that prevents excessive solder accumulations. Secondly, they act as stops, which prevent ancillary devices from indiscriminately floating about in emulsified solder. Accordingly, the side tabs maintain the relative position of the ancillary devices throughout subsequent processing.

BRIEF DESCRIPTION OF THE DRAWINGS

FIGS. 2A, 2B and 2C depict an exploded view, a bottom view and a sectional view of an alternate embodiment of the load compensation device and its use according to the invention.

DETAILED DESCRIPTION OF THE PREFERRED EMBODIMENT

Figure 1A:
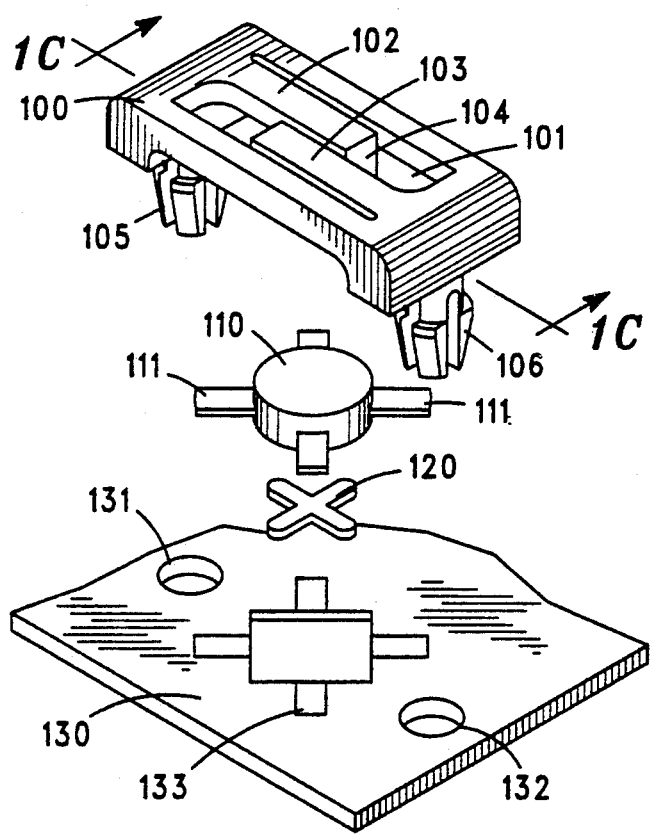
FIGS. 1A, 1B and 1C depict an exploded view, a bottom view, and a sectional view of the load compensation device and its use according to the invention.

FIG. 1A is an exploded view of the load compensation device and its use according to the invention. The load compensation device is shown as 100 in FIG. 1A. The device has a centrally located cavity 101 which accepts electronic components to be soldered to a Printed Circuit Board (PCB) 130. The cavity 101 is surrounded on four sides by device sidewalls. Collectively, the device sidewalls define a fence.

Attached to opposing fence sidewalls are a pair of cantilever beams 102 and 103. These structures extend into the fence cavity, and are designed to make contact with electronic components, like power transistor 110. Contact is achieved through a cantilever beam tab 104, which extends substantially perpendicularly from each cantilever beam into the fence cavity. While only one cantilever beam tab is seen in FIG. 1A, it should be noted that each cantilever beam is equipped with a cantilever beam tab.

In order to fasten the device 100 to a PCB 130, double slotted pegs 105 and 106 are employed. Each peg has four tapered posts, each having a flanged lip. Because the posts are flexible, i.e. collapsible, the circumference of the peg measured around the flanged lips is variable. Under compression, the slotted peg circumference will decrease. When the compressing force is removed, however, the peg circumference will return to its normal periphery.

PCB holes 131 and 132 are smaller in circumference than are uncompressed pegs 105 and 106. When these tapered collapsible pegs are inserted into the holes, however, a compressing force is applied to the flanged lips of each post by the hole sidewalls. As previously discussed, the slotted pegs circumference will decrease under the compression exerted by the hole sidewalls. By design, the reduced peg circumference will allow the pegs to pass through the holes in the PCB. As the flanged lips pass through the holes, they eventually lose contact with the hole sidewalls. When this compressing force is removed, the pegs will regain their original circumference. Due to the increased peg circumference and the flanged lips on each post, the pegs are no longer capable of exiting the holes in the PCB.

In operation, solder paste is deposited on the footprint contacts 133 of the PCB 130. Next, solder preform 120 is placed on the PCB 130 as shown in FIG. 1A. The electronic component 110 is then positioned on the PCB 130 such that the electronic component leads 111 make contact with the PCB footprint contacts 133. Next, the load compensation device 100 is positioned over the electronic component 110 while Slotted pegs 105 and 106 are inserted into holes 131 and 132 of the PCB 130. As the pegs pass through the PCB holes, the cantilever beams 102 and 103 make contact with the electronic component 110 via cantilever beam tabs 104. The resultant force causes cantilever beams 102 and 103 to deflect, thereby pressing and holding electronic component 110 in place. In this way, electronic component placement, lead surface area contact, and void-free soldering are all achieved by the cantilever beam force which urges the electronic component toward the PCB, thereby maintaining its position relative to the PCB footprint contacts during soldering. Because the load compensation device 100 is made of a poor heat and electrical conducting material, electronic component placement is achieved without the compromises associated with the use of metallic workpieces.

According to the present invention, the load compensation device is made of a thermoplastic resin. This material combines the relatively high temperature performance of metallics with enough ductile capabilities in order to insure the elasticity of the cantilever beams and the collapsible slotted pegs throughout the reflow soldering process. For the present embodiment 13% glass filed nylon represents an ideal combination of resin and filler to achieve proper device elasticity, taking into consideration bake cycle temperature and time. Depending on other applications, however, several other thermoplastic resins are available, for example: Polyamide, Polyamide-imide, Polyether-imide, Polyaryletherketone, Polyaryl Sulfone, and Liquid Crystal Polymers.

It will be appreciated by those skilled in the art that the load Compensation device of the present invention is producible utilizing various injection-molded or extrusion techniques like those heavily employed in the field of plastics. For additional discussion on state of the art injection molding and extrusion techniques, refer to: Dubois, H. J., Pribble, W. I., "Plastics Mold Engineering Handbook," 3rd Edition, Van Nostrund Reinhold Company, New York 1978.

It is desirable that the load compensation devices of the present invention remain relatively elastic even after temperature cycling, in order to facilitate their removal. While the load compensation device is completely integratable into the PCB design, i.e. may remain on the PCB, by simply compressing those portions of the slotted pegs that extend through the PCB; the load compensation device is removable. In most instances, however, load compensation device removal is not suggested. Handsome time savings are realized by complete integration. Moreover, those portions of the slotted pegs that protrude through holes in the PCB are available to assist in the alignment and registration of the PCB with subsequent assemblies.

Figure 1B:
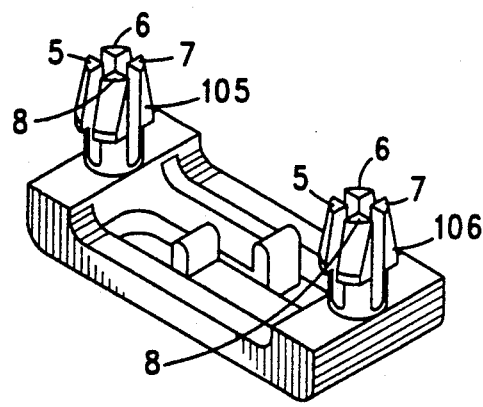

FIG. 1B depicts a bottom view of the load compensation device 100. From this perspective, slotted pegs 105 and 106 are visible. Accordingly, the flexible posts 5, 6, 7, and 8, which combine to provide these snap fit insertion and retention mechanisms are also revealed.

Figure 1C:
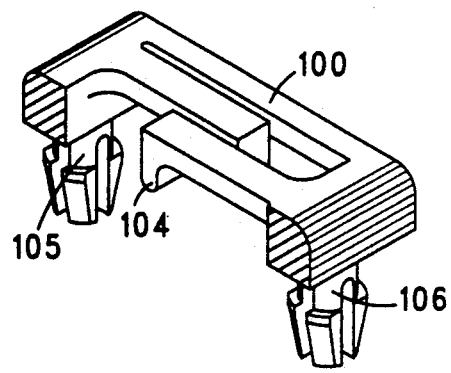

FIG. 1C depicts a sectional view of the load compensation device. This particular perspective reveals the relationship whereby cantilever beam tabs 104, extend into the fence cavity in order to make contact with an electronic component. In addition, the tapered cantilever beam tab design is also observable.

FIG. 2A is an exploded view of an alternate embodiment of the load compensation device and its use according to the invention. The load compensation device is shown as 200 in FIG. 2A. This device, like other embodiments, has a centrally located cavity 201 referred to as the fence cavity. This aperture permits the positioning of electronic component 210, relative to the footprint contacts 233 on PCB 230. The fence cavity 201 is surrounded by four sidewalls. Collectively, the fence sidewalls define a fence. Of note, the fence sidewalls of the present embodiment are tapered in order to assist in the subsequent placement and positioning of the electronic component 210 and the ancillary devices 218.

Attached to one pair of opposing fence sidewalls are a pair of cantilever beams 202 and 203. These structures extend into the fence cavity 201, and are designed to make contact with electronic component 210. Contact is achieved through a cantilever beam tabs 204, which extends substantially perpendicularly from each cantilever beam into the fence cavity. In order to maximize cantilever beam yield, the cantilever beam tabs 204 employ a tapered design whereby they have a reduced cross sectional width at the point of contact with electronic component 210 than their width at the point of connection to cantilever beams 202 or 203. This design has proven to apply a greater beam force to the electronic component 210 than does a tab of uniform width. While only one cantilever beam tab is seen in FIG. 2A, it should be noted that each cantilever beam is equipped with a cantilever beam tab 204.

Attached to another opposing pair of fence sidewalls are a pair of side tabs 205 and 206. These structures extend into the fence cavity, and are designed to provide a positioning guide for ancillary devices 218, as well as a solder shut-off to prevent excessive accumulation of solder during reflow soldering. In addition, these tabs are designed to hold solder preform 219 in place.

In order to affix the device 200 to a PCB 230, double slotted pegs 207 and 208 are employed. For a more detailed discussion of slotted peg operation, refer to the description of slotted pegs 105 and 106 of FIG. 1A. Slotted pegs 207 and 208 are identical to the pegs discussed under FIG. 1A. While only one particular embodiment of a snap fit insertion mechanism has been shown and described herein, it will be obvious to those skilled in the art that additional fasteners may be employed with the load compensation devices 100 and 200 without departing from the spirit of this invention.

In operation, solder paste is deposited on the PCB footprint contacts 233. Next, solder preform 220 is positioned on the PCB 230 as shown in FIG. 2A. The electronic component 210 is then placed on the PCB 230. Next, solder preform 219 is placed on the leads 212 of component 210. Next, the load compensation device 200 is positioned over the electronic component 210 while slotted pegs 207 and 208 are inserted into holes 231 and 232 of the PCB 230. As the pegs pass through the PCB holes, the cantilever beams 202 and 203 make contact with the electronic component 210 via cantilever beam tabs 204. The resultant force causes cantilever beams 202 and 203 to deflect, thereby pressing and holding the electronic component 210 in place. Finally, ancillary devices 218 are placed in position relative to the component 210 contact leads 212. Afterwards, side tabs 205 and 206 act as ancillary device guides, thereby restraining ancillary devices 218 from indiscriminately repositioning themselves. In this way, electronic component placement, lead surface area contact, ancillary device positioning, and void-free reflow soldering are all optimized by the cantilever beam force which urges the electronic component 210 towards the PCB 230, while the load compensation device 200 establishes and maintains the component 210 and ancillary device 218 positions.

FIG. 2B depicts a partial sectional view of the alternate load compensation device embodiment. Of importance, the partial sectional view reveals that this particular embodiment utilizes side tabs 205 and 206. In addition this embodiment has tapered sidewalls. These modifications are employed in order to facilitate the ease of ancillary device and electronic component positioning and placement. The tapered sidewalls provide a ramped entrance into the cavity 201, thereby easing ancillary device placement. Moreover, the beveled shape created by the tapered sidewalls tends to urge the electronic component 210 into the center of the cavity 201, thereby assisting in the components positioning.

FIG. 2C depicts a bottom view of the alternate load compensation device embodiment. This view shows slotted pegs 207 and 208. In addition, the position of the fence side tabs 205 and 206 are identified. Once again, cantilever beam tabs 204 are shown extending into the fence cavity 201 in order to make contact with the electronic component. Moreover, the beveled shape created by the tapered sidewalls is evidenced. Finally, FIG. 2C reveals the utilization of preform guides 209. These tapered members are designed to assist in the alignment of solder preforms 219, prior to their being held in place by side tabs 205 and 206.

Figure 3:
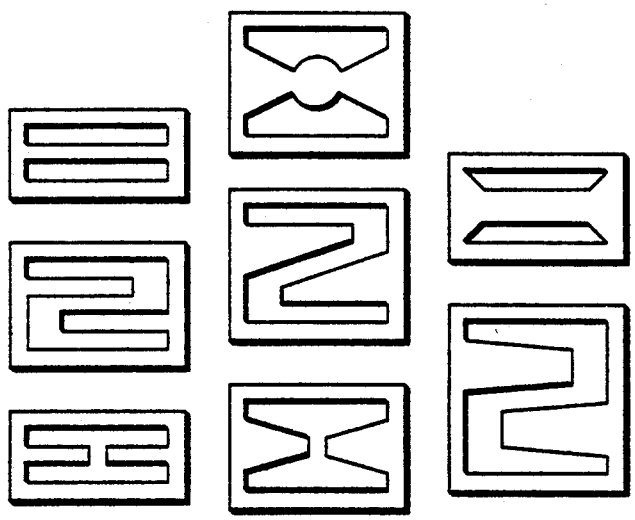
FIG. 3 depicts several alternate beam configurations which may be employed by the load compensation device according to the invention.
Figure 3:
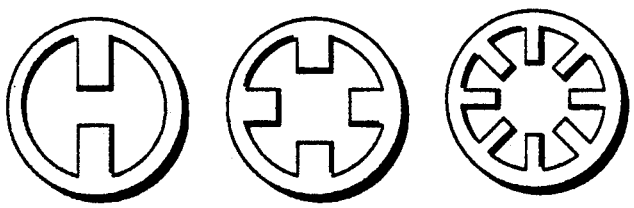

While only particular embodiments of the invention have been shown and described herein, it will be obvious that additional modifications may be made without departing from the spirit of this invention. For this reason FIG. 3 depicts several alternate beam configurations which may be employed by the load compensation device according to the invention. Still, it is not intended that this invention be limited, except as indicated by the appended claims.

What is claimed is:

1. A load compensation device for fastening an electronic component having conductive leads to a substrate comprising:
   receiving means having a cavity for receiving an electronic component having conductive leads;
   fastening means connected to the receiving means for fastening the receiving means and the electronic component to the substrate; and
   urging means connected to the receiving means for urging the electronic component towards the substrate while maintaining conductive lead positions relative to contacts on the substrate, such that component placement and lead surface area contact is optimized by urging means force, which presses and holds the electronic component in place.

2. The device according to claim 1 further comprising restraining means connected to the receiving means and extending into the cavity for restraining the position of ancillary devices during soldering procedures.

3. The device according to claim 2 wherein the receiving means, fastening means, restraining means, and urging means are integral to the load compensation device.

4. The device according to claim 1 wherein the device is produced via a process selected from the group consisting of: extruding and injection molding.

5. The device according to claim 3 wherein the receiving means, fastening means, restraining means, and urging means are made from materials selected from the group of resins consisting of: plastics, thermoplastics, and thermoset plastics.

6. The device according to claim 1 wherein the substrate comprises a surface for receiving an electronic component.

7. The device according to claim 1 wherein the receiving means need not be removed from the substrate.

8. A load compensation device for fastening an electronic component on a substrate comprising:

a fence having a cavity for receiving the electronic component;

a peg attached to the fence for holding the fence on the substrate;

a beam attached to the fence and extending into the fence cavity for making contact with the electronic component; and a side tab attached to the fence and extending into the fence cavity for restraining the movement of ancillary devices, whereby component placement and lead surface area contact is optimized by a beam force which presses and holds the electronic component in place.

9. The device according to claim 8 wherein the fence, beam, peg, and side tab are integral to the load compensation device.

10. The device according to claim 8 wherein the fence, beam, peg, and side tab are produced via a process selected from the group of processes consisting of: extruding and injection molding.

11. The device according to claim 8 wherein the fence, beam, peg, and side tab are made from materials selected from the group of resins consisting of: plastics, thermoplastics, and thermoset plastics.

12. The device according to claim 8 wherein the beam makes contact with the electronic component via a beam tab.

13. The device of claim 12 wherein the beam tab extends substantially perpendicular from the beam into the fence cavity.

14. The device of claim 13 wherein the beam tab has a tapered shape.

15. The device according to claim 8 wherein the fence need not be removed from the substrate.

16. A load compensation device for fastening multi-planar or multi-leaded surface mount electronic components on a substrate during soldering comprising:

a fence having a cavity for positioning electronic components relative to contacts on the substrate;

a plurality of pegs connected to the fence for holding the fence on the substrate;

a plurality of beams connected to the fence and extending into the fence cavity for making contact with the electronic components; and a plurality of side tabs connected to the fence and extending into the fence cavity for restraining the movement of ancillary devices during soldering, whereby component placement and lead surface area contact is optimized by beam forces which press and hold the electronic component in place.

17. The device according to claim 16 wherein the fence, beams, pegs, and side tabs are integral to the load compensation device.

18. The device according to claim 17 wherein the fence, beams, pegs, and side tabs are produced via a process selected from the group of processes consisting of: extruding and injection-molding.

19. The device according to claim 18 wherein the fence, beams, pegs, and side tabs are made from materials selected from a group of resins consisting of: plastics, thermoplastics, and thermoset plastics.

20. The device according to claim 16 wherein the plurality of pegs protrude through holes in the substrate and assist in the alignment of subsequent assemblies.

* * * * *